(12) United States Patent
Gajendran et al.

(10) Patent No.: US 7,752,004 B1
(45) Date of Patent: Jul. 6, 2010

(54) METHOD AND APPARATUS FOR CONFIGURING PLURALITY OF DEVICES ON PRINTED CIRCUIT BOARD INTO DESIRED TEST PORT CONFIGURATION

(75) Inventors: Indrajit Rajeev Gajendran, Saratoga, CA (US); Biju Raghaven Nair, Sunnyvale, CA (US); Kirk Dow Sanders, San Jose, CA (US)

(73) Assignee: Cisco Technology, Inc., San Jose, CA (US)

( * ) Notice: Subject to any disclaimer, the term of this patent is extended or adjusted under 35 U.S.C. 154(b) by 679 days.

(21) Appl. No.: 10/754,823

(22) Filed: Jan. 9, 2004

(51) Int. Cl.
  *G01R 31/28* (2006.01)
(52) U.S. Cl. .................. 702/117; 702/123; 324/527; 324/537; 714/729; 714/733
(58) Field of Classification Search .............. 702/57, 702/58, 108, 117–121, 123; 324/500, 512, 324/527, 537, 763; 714/726, 727, 729, 733
See application file for complete search history.

(56) References Cited

U.S. PATENT DOCUMENTS

| | | | | |
|---|---|---|---|---|
| 4,488,299 A | * | 12/1984 | Fellhauer et al. | 714/724 |
| 4,896,055 A | * | 1/1990 | Fujii et al. | 326/13 |
| 4,947,357 A | * | 8/1990 | Stewart et al. | 714/726 |
| 5,764,076 A | * | 6/1998 | Lee et al. | 326/38 |
| 5,909,451 A | * | 6/1999 | Lach et al. | 714/726 |
| 5,925,143 A | * | 7/1999 | Gillis et al. | 714/726 |
| 6,886,110 B2 | * | 4/2005 | O'Brien | 714/34 |
| 2002/0163826 A1 | * | 11/2002 | Devlin et al. | 365/63 |
| 2003/0009715 A1 | * | 1/2003 | Ricchetti et al. | 714/727 |
| 2003/0056154 A1 | * | 3/2003 | Edwards et al. | 714/45 |
| 2003/0101395 A1 | * | 5/2003 | Man et al. | 714/726 |

* cited by examiner

*Primary Examiner*—Manuel L Barbee
(74) *Attorney, Agent, or Firm*—Patent Capital Group

(57) ABSTRACT

A system on a circuit board includes a plurality of devices designed to access an electronic system on the circuit board, and a programmable logic device (PLD) connected to the plurality of devices. Each of the plurality of devices complies with a test port architecture. The PLD interfaces the plurality of devices with a test port. The PLD is capable of configuring different connectivity among the plurality of devices based on the program implemented and the assertion of input control signals. A method and apparatus configures a plurality of devices on a circuit board into a desired configuration using the PLD. The configuration includes (a) receiving a control signal at the PLD, (b) configuring at least one of the plurality of devices into a chain based on the control signal, and (c) coupling the configured chain to the test port via the PLD.

38 Claims, 18 Drawing Sheets

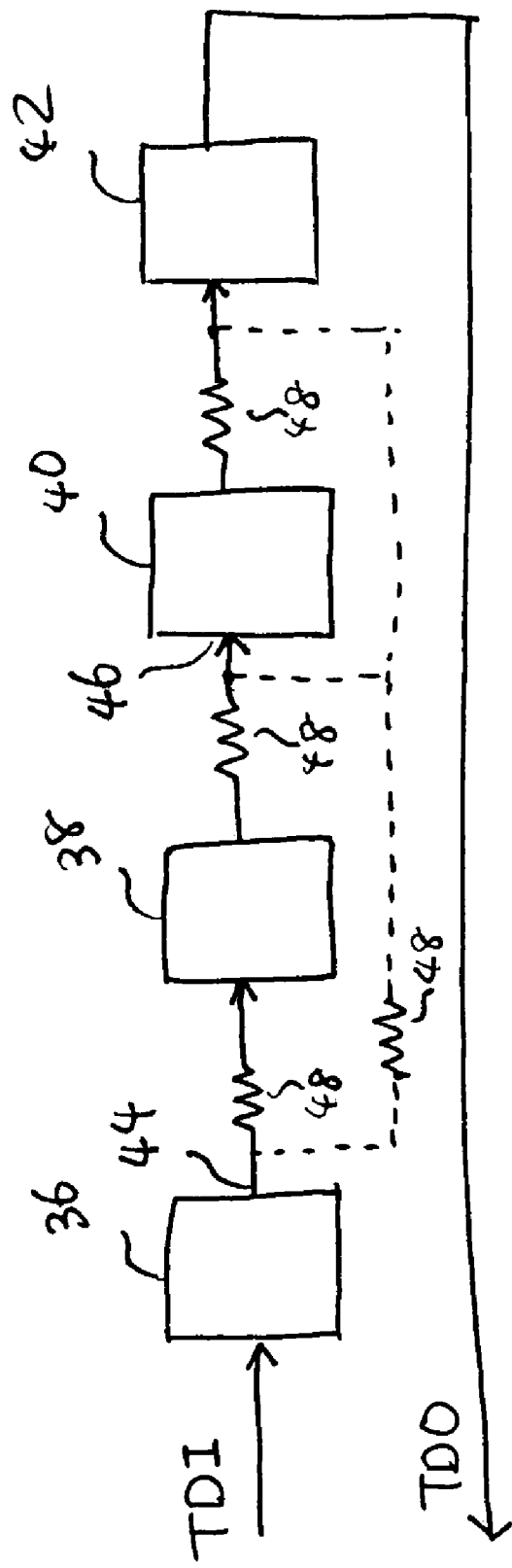

METHOD AND APPARATUS FOR CONFIGURING PLURALITY OF DEVICES ON PRINTED CIRCUIT BOARD INTO DESIRED TEST PORT CONFIGURATION

FIELD OF THE INVENTION

The present invention relates to a printed circuit board design. More particularly, the present invention relates to a method and apparatus for configuring a plurality of devices on a printed circuit board into a desired configuration, where the devices comply with a test port architecture.

BACKGROUND OF THE INVENTION

The Joint Test Action Group (JTAG) Test Access Port and Boundary-Scan Architecture was originally defined to access and test integrated circuits (ICs) after installation on printed circuit boards (PCBs), and the methodology became Institute of Electrical and Electronic Engineers (IEEE)/American National Standards Institute (ANSI) Standard 1149.1. FIG. 1 schematically illustrates a conventional IEEE 1149 Boundary-Scan architecture. As shown in FIG. 1, the JTAG architecture (the IEEE 1149 standard) includes a test access port (TAP) 10 with four or five pins, and a chain of Boundary-Scan cells (BSCs) 12 surrounding internal logic 14 to be optionally tested. The four mandatory pins include two data pins: Test Data In (TDI) and Test Data Out (TDO), and two common pins: Test Clock (TCK) and Test Mode Select (TMS). A Test Reset (TRST) is an optional common pin. This architecture applies to the board and each IC which is part of the board.

FIG. 2 schematically illustrates an example of conventional BSC 12. The BSC 12 may be used at the input or output pins for the internal logic. During a normal operation the input signal is applied to the Data_In pin and passes trough a multiplexer 16 to the internal logic. When the cell is used as an output pin, the data from the internal logic are received at the Data_In and pass through the multiplexer 16 to the output of the chip. In the test mode, the data (test data) are coming through TDI, latched for internal testing or to be shifted to the next BSC when the clock is activated.

Although modern PCBs contain exotic IC packages which sometimes contain tens of millions of transistors, PCB designers still implement the JTAG (IEEE 1149) test port and scan chain using the methods unchanged in over a decade. Nowadays, however, the JTAG test interface, which complies with IEEE 1149 standard, is used for variety of applications. For example, the following applications are currently in use.

FIG. 3A schematically illustrates an example of a device chain (JTAG chain) 22 in the manufacturing test applications such as Boundary-Scan test or Built-in Self-test (BIST). The Boundary Scan test is a manufacturing test, in which test patterns are shifted into the device and driven out on the pins to external test points. An in-circuit test (ICT) fixture drives or reads these test patterns to test the PCB for open circuits, short-circuits, and other defects. The BIST is somewhat similar to the Boundary-Scan test except that the test patterns shifted in are used to trigger test sequences within the IC and to report the test results. As shown in FIG. 3A, a typical test configuration requirement is to wire all of the test devices 20 (20a, 20b, ...) into a single large chain 22 such that a TDO pin of a test device is connected to a TDI pin of the next test device. Each test device 20 may be a BSC, or other test device used in the BIST. The first test device 20a in the chain receives the test data from a TAP 24, and the TDO of last test device 20e in the chain is input to the TAP 24. The common signals TCK, TMS, and TRST are input to each of the test devices 20 from the TAP 24. The Data_In and Data_Out pins are coupled to external test points.

FIG. 3B schematically illustrates an example where a JTAG interface is used for downloading configuration data into programmable logic devices such as programmable logic devices (PLDs) or field programmable gate arrays (FPGAs) during laboratory bring-up or manufacturing. As shown in FIG. 3B, a programmable device 21 is configured via a connector 23 which interfaces to a computer or other programming fixture. The programmable device 21 may also be a group of programmable devices chained together for the purpose of this application.

FIG. 3C schematically illustrates an example where a JTAG interface is used to provide emulation tools with access to a central processing unit (CPU) or digital signal processor (DSP) core 25. Such a tool may be a development tool running on a laboratory computer connected to a PCB (or system under development) 27 via a cable. These tools are used during development, for example, to download code into a new CPU or DSP core, and to execute or debug the code.

FIG. 3D schematically illustrates an example where a JTAG interface is used to fix internal bugs contained in logic 31 which are already being used for a certain application. Typically, some internal logic is not accessible to the user in a normal operational mode. However, in many devices, vital registers and pieces of memory are accessible via the JTAG chain in a test mode. Thus, bugs or defects in early IC revisions, if any, can be corrected or bypassed by updating memory locations or setting bits in registers during initialization through the JTAG chain. A special bug-fixing logic 33 is typically required to be implemented for such bug-fixing.

However, a conventional JTAG chain topology (daisy chain) leads to certain common problems during design, debug, and manufacturing of the circuit due in part to the incompatible needs of various application as described below.

FIG. 4 schematically illustrates part of a conventional JTAG chain of mixed-voltage devices. As shown in FIG. 4, some devices in the chain may use different supply voltages and thus may have different requirements for voltage levels to be driven in on their TDI pin while the device is not powered up. For example, if a 5-V supply powers up a first device 30 while a second device 32 does not have power from a 3.3-V supply, an output signal of the first device 31 may damage the second device 32. Thus, different voltage parts may have to be electrically isolated from each other to avoid such damage. Conventionally, in order to avoid such damage, a buffer 34 is provided at the TDI and other inputs of the device 32, and the inputs are enabled only when a "power-good" signal is asserted. QUICC switch devices may also used to isolate devices with a different voltage requirement. However, these conventional solutions are costly and waste space since a buffer is required for each combination of devices having different operational voltage levels.

FIG. 5A schematically illustrates an example of a stuff option in a conventional JTAG chain including devices 36, 38, 40, and 42. Resistor stuff options are provided to a JTAG chain to implement a different topology to bypass one or more devices in the chain, typically in order to save cost. For example, if a customer design does not stuff the device 38, the output (TDO pin) 44 of the test device 36, which is originally routed to the TDI pin of the next device 38, has to be routed to the TDI pin 46 of the device 40. Such a re-route is conventionally implemented with a set of stuff option resistors 48 such that the TDO signal is re-routed to a TDI pin of a desired test device. FIG. 5B schematically illustrates such a re-routing where the stuff option resistor 48*a* is installed and the device 38 and corresponding option resistors are de-stuffed. The example in FIG. 5A is also capable of re-routing the TDO pin of the test device 36 to the TDI pin of the test device 42 when both of the test devices 38 and 40 are not stuffed. However, when a large number of stuff options need to be implemented, in addition to making the schematic complicated and hard to follow, there is a risk of introducing design errors and/or manufacturing errors into the system. Furthermore, in the case where a stuff option is not planned for in advance of the PCB fabrication, implementing it later almost always requires reworking or redesign of the PCB to correctly re-route the JTAG chain to support the stuff option.

As discussed above, the JTAG chain is also used to download configuration data into programmable devices such as PLDs or FPGAs. Since programmable devices are made by various vendors, a JTAG chain may include devices from different vendors, as shown in FIG. 5C. Since each vendor may use a different method or scheme to implement the download, a specific download or test scheme of one vendor may not be interoperable with another vendor's device which is in the way to the vendor's target device. This problem is typically not discovered until after PCB fabrication, and also requires to determine which vendor's scheme is incompatible with which vendor's devices. The only way around the problem is to isolate the incompatible vendor's devices on their own chain, as shown in FIG. 5D. This reconfiguration of the JTAG chain requires rework in the form of wires or redesign of the PCB for each particular application.

The isolation problem also occurs when the JTAG chain is used by various hardware emulation and debug tools as an interface with a processors such as CPU or DSP. Through the JTAG interface, code can be downloaded into the processor and output from the processor can be retrieved for debug. When initially bringing up a new processor, it may be required or desirable to have specific devices electrically isolated from the JTAG signals of other devices, for correct and efficient debug and fault isolation. Similarly, when one or more specific CPU or DSP devices need bug-fixing, as discussed above, the target device or devices should be electrically isolated from other devices. Without isolated accesses, the CPU or DSP devices may not operate correctly. In order to isolate one or more specific devises, the stuff option resistors are conventionally used to reconfigure the JTAG chain in the laboratory as explained above .

BRIEF DESCRIPTION OF THE INVENTION

A system on a circuit board includes a plurality of devices designed to access an electronic system on the circuit board, and a programmable logic device (PLD) connected to the plurality of devices. Each of the plurality of devices complies with a test port architecture. The PLD interfaces the plurality of devices with a test port. The PLD is capable of configuring different connectivity among the plurality of devices based on the program implemented and the assertion of input control signals. A method and apparatus configures a plurality of devices on a circuit board into a desired configuration using the PLD. The configuration includes (a) receiving a control signal at the PLD, (b) configuring at least one of the plurality of devices into a chain based on the control signal, and (c) coupling the configured chain to the test port via the PLD.

BRIEF DESCRIPTION OF THE DRAWINGS

The accompanying drawings, which are incorporated into and constitute a part of this specification, illustrate one or more embodiments of the present invention and, together with the detailed description, serve to explain the principles and implementations of the invention.

In the drawings:

FIG. 5A is an electrical block diagram schematically illustrating an example of a stuff option in a conventional JTAG chain.

DETAILED DESCRIPTION

Figure 1:
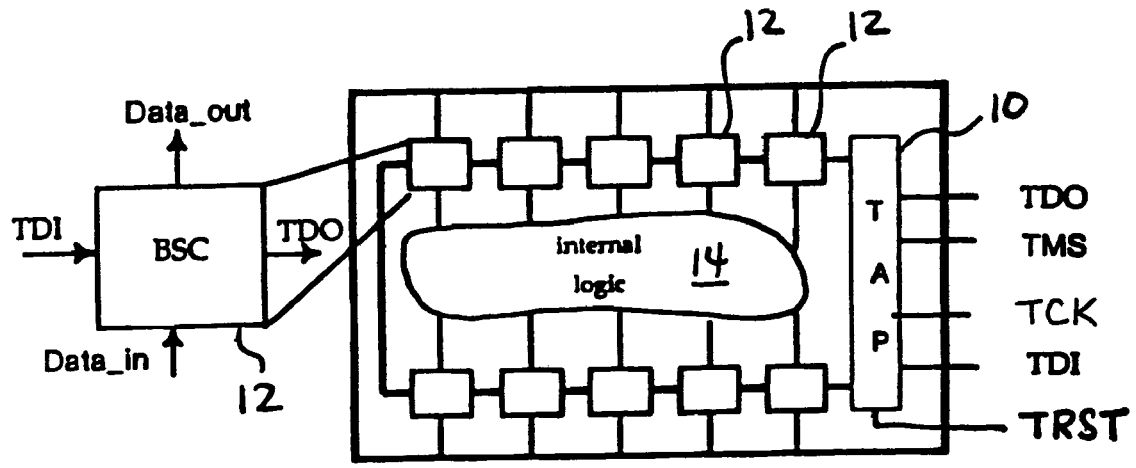
FIG. 1 is a diagram schematically illustrating a conventional IEEE 1149 Boundary-Scan architecture.
Figure 2:
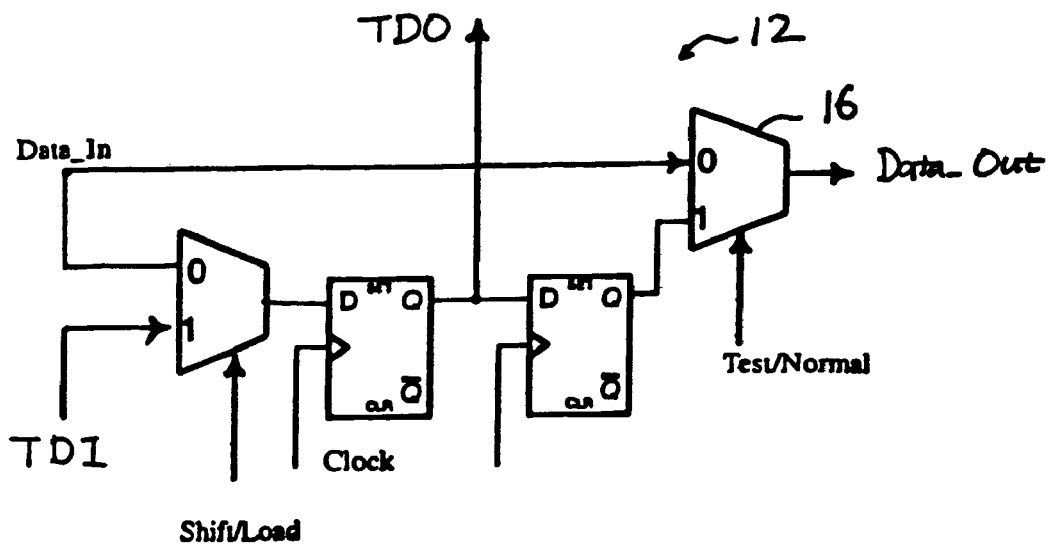
FIG. 2 is an electrical block diagram schematically illustrating an example of conventional Boundary-Scan Cell.
Figure 3A:
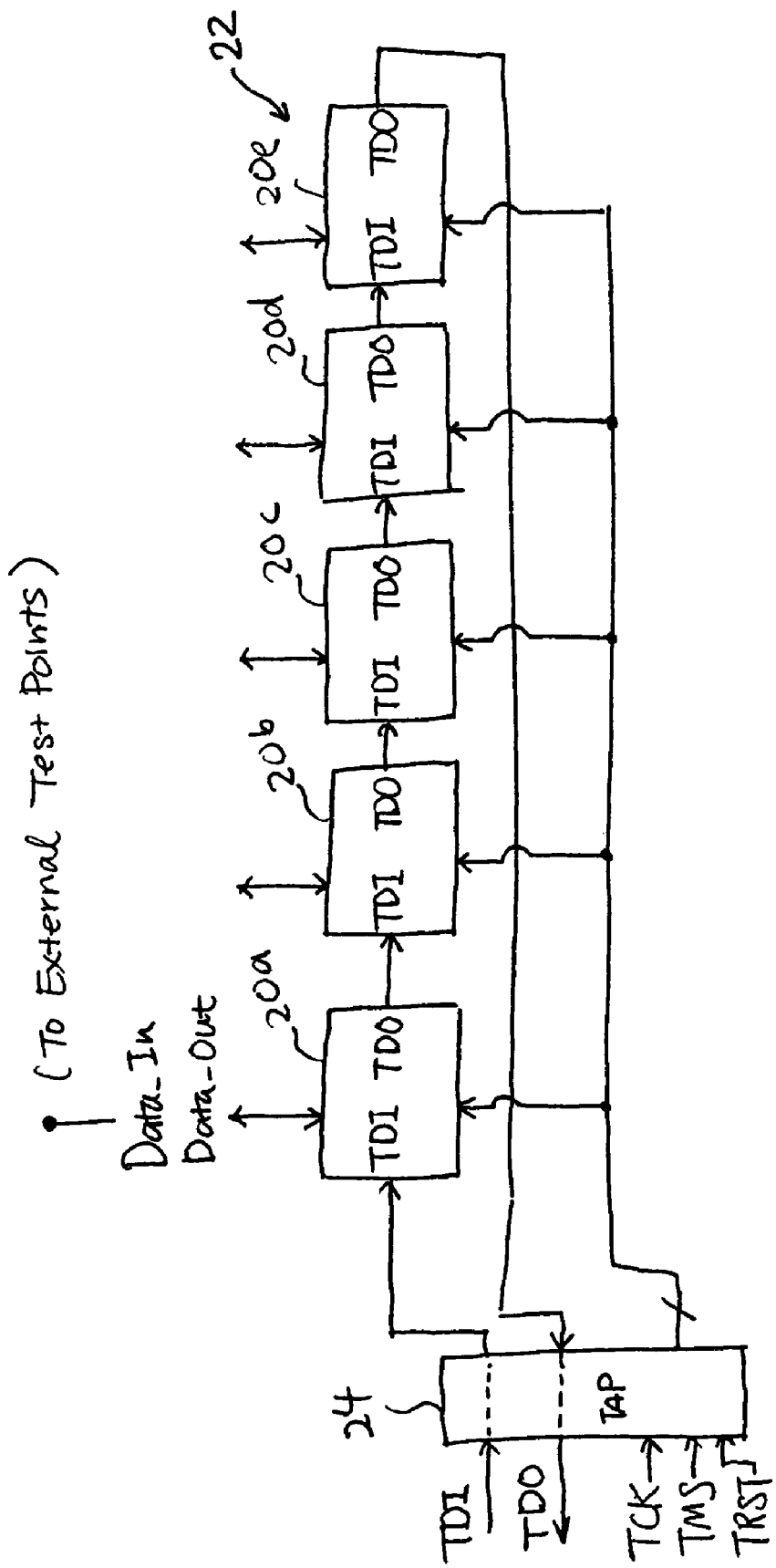
FIG. 3A is a block diagram schematically illustrating an example of a device chain in the manufacturing test applications such as Boundary-Scan test or Built-in Self-test.
Figure 3B:
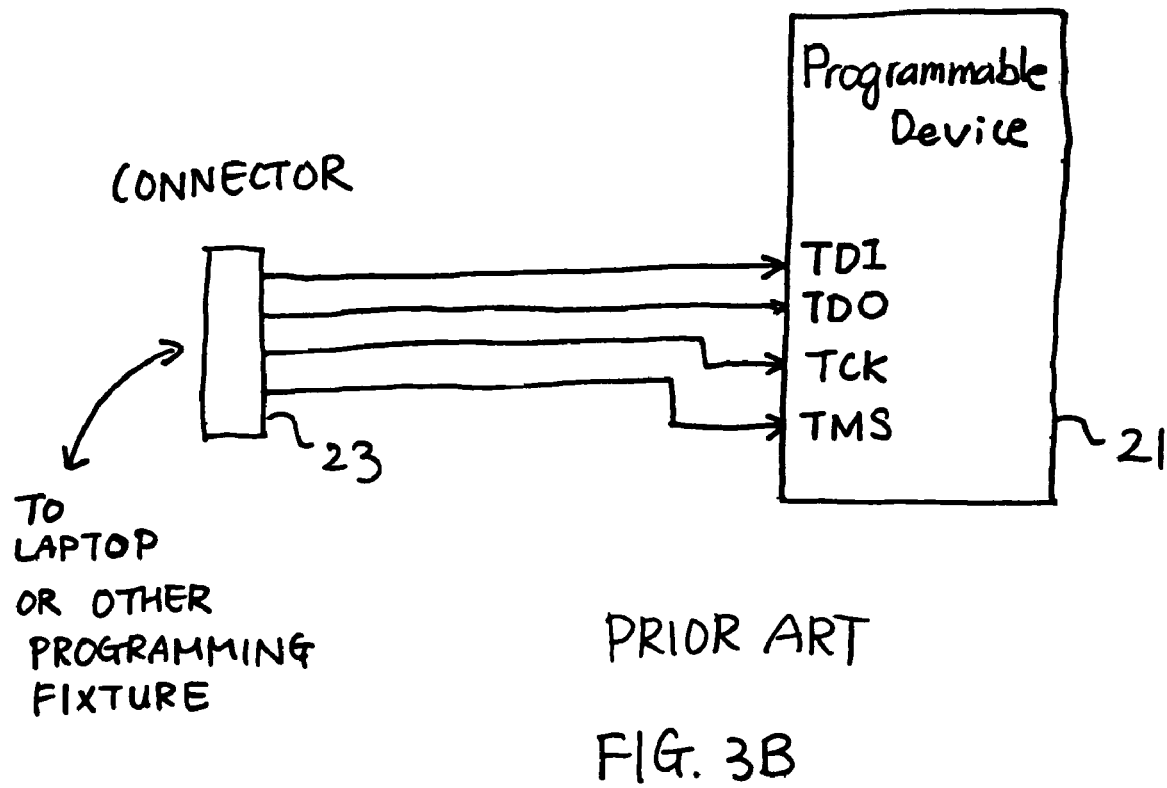
FIG. 3B is a block diagram schematically illustrating an example where a JTAG interface is used for downloading configuration data into programmable logic devices.
Figure 3C:
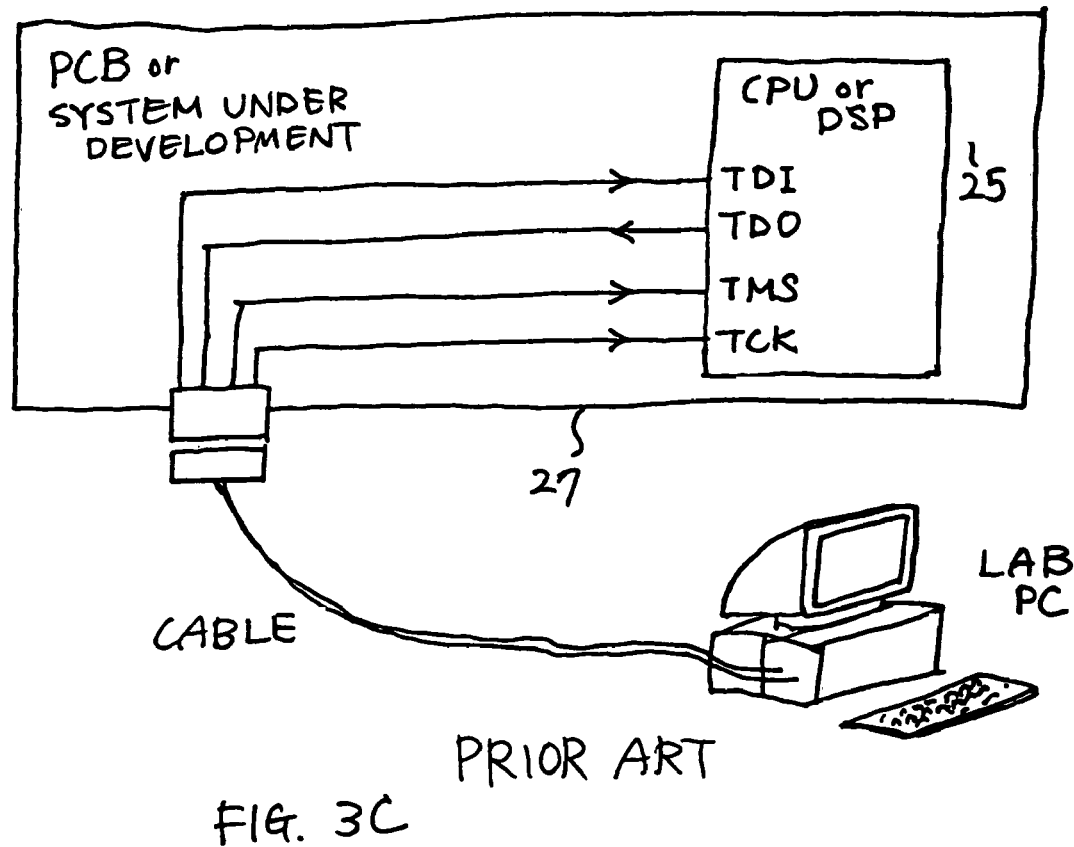
FIG. 3C is a diagram schematically illustrating an example where a JTAG interface is used to provide emulation tools with access to a central processing unit (CPU) or digital signal processor (DSP) core.
Figure 3D:
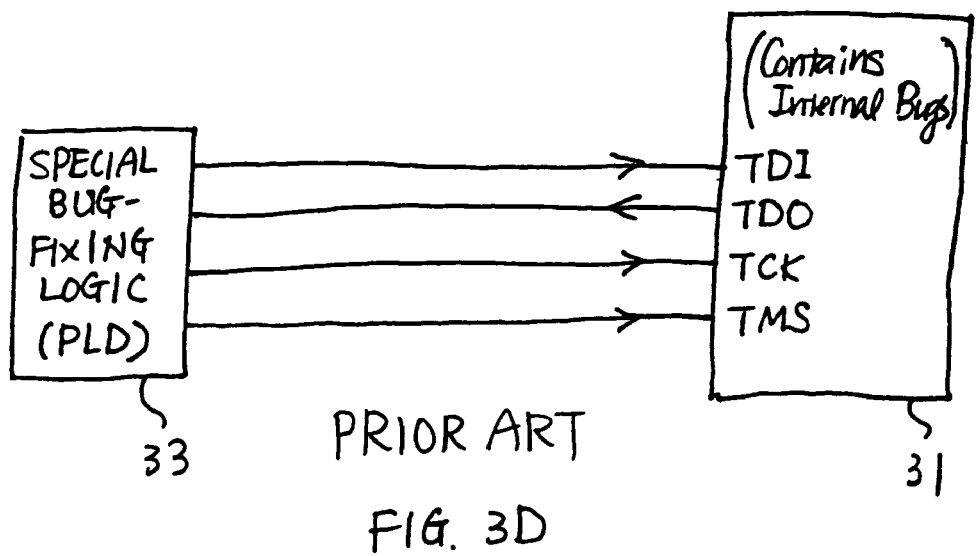
FIG. 3D is a block diagram schematically illustrating an example where a JTAG interface is used to fix internal bugs contained in logic which are already being used for a certain application.
Figure 4:
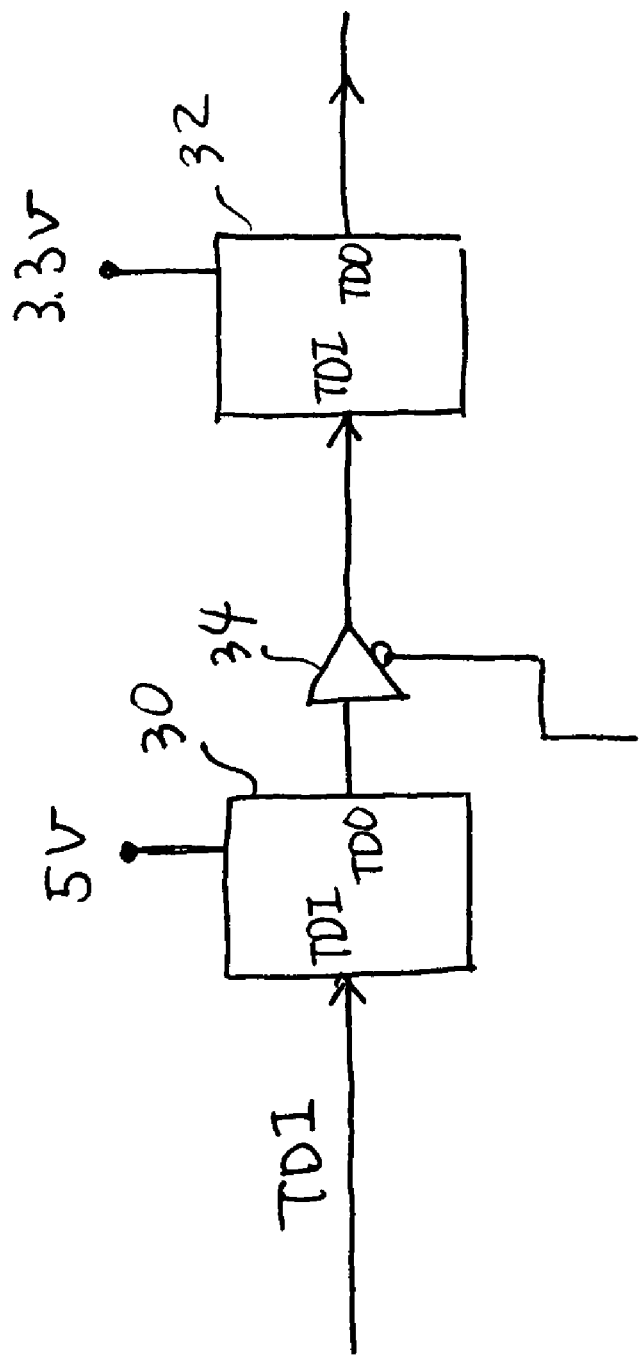
FIG. 4 is an electrical block diagram schematically illustrating part of a conventional JTAG chain of mixed-voltage devices.
Figure 5B:
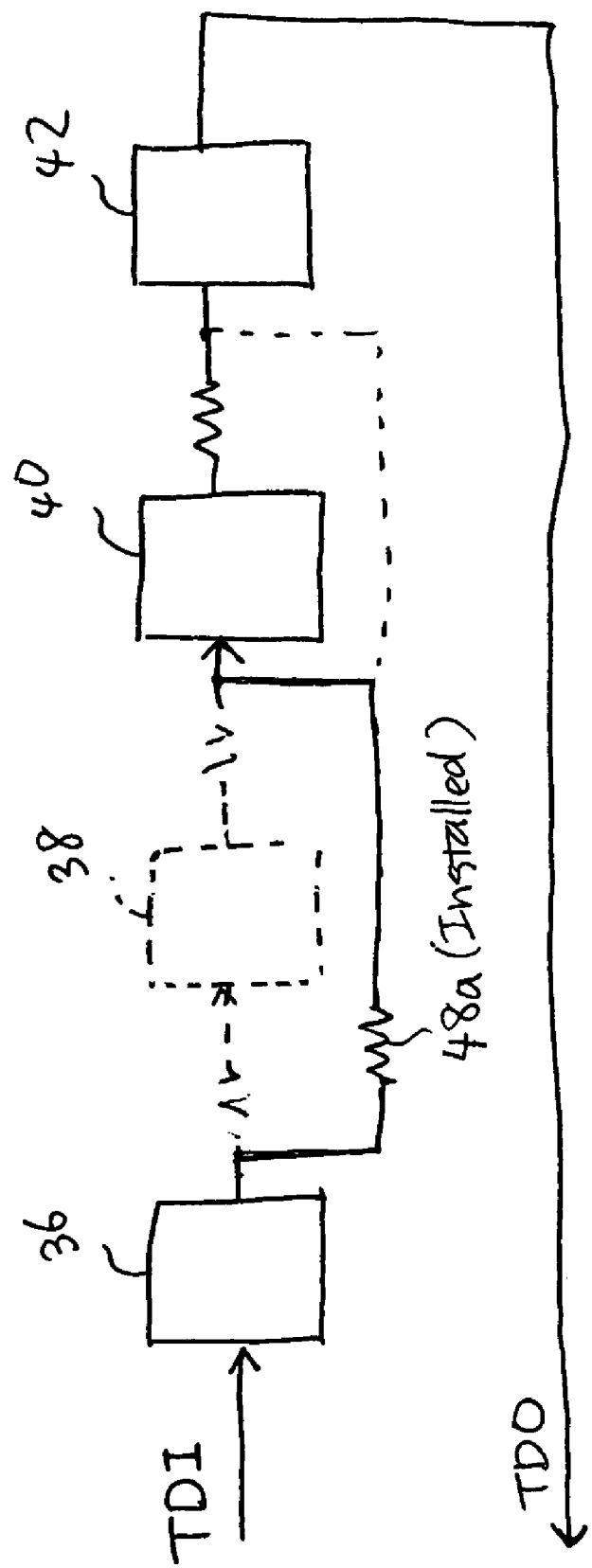
FIG. 5B is a diagram schematically illustrating an example of re-routing using stuff option resistors in a conventional JTAG chain.
Figure 5C:
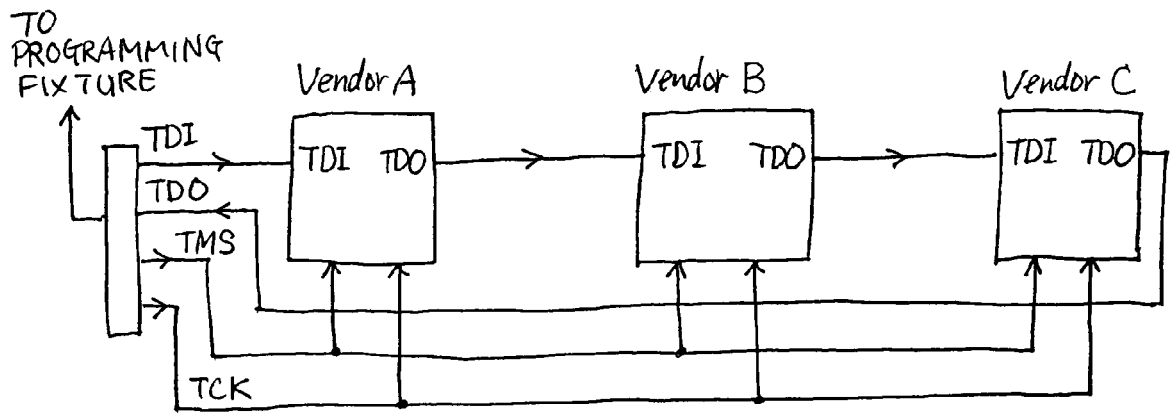
FIG. 5C is an electrical block diagram schematically illustrating a conventional JTAG chain including devices from different vendors.
Figure 5D:
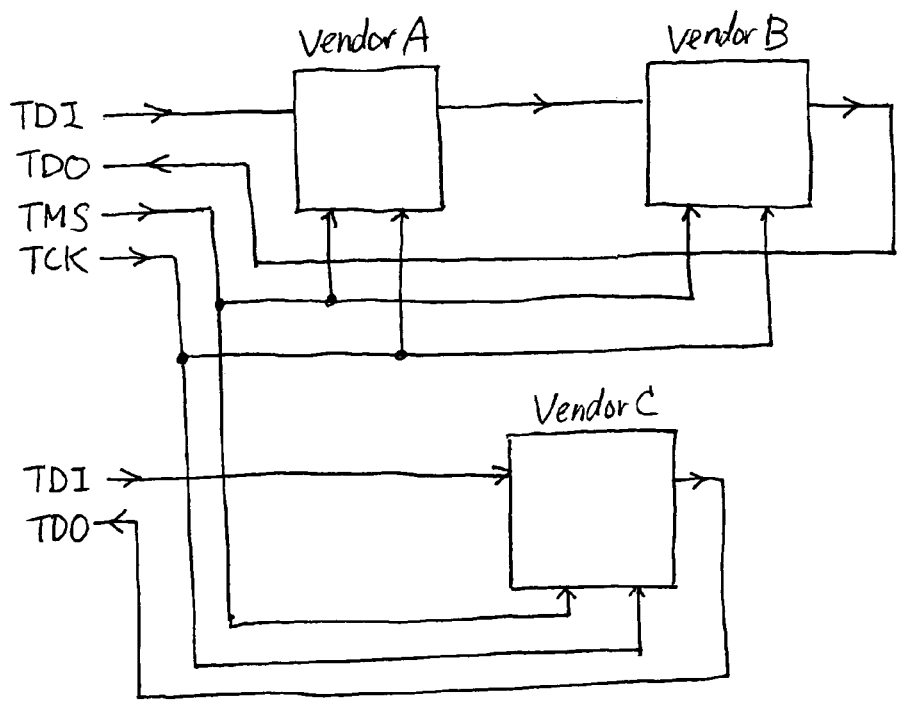
FIG. 5D is an electrical block diagram schematically illustrating a reconfigured JTAG chain isolating an incompatible vendor's devices on their own chain.

Embodiments of the present invention are described herein in the context of a method and apparatus for configuring a plurality of devices on a printed circuit board into a desired configuration. Those of ordinary skill in the art will realize that the following detailed description of the present invention is illustrative only and is not intended to be in any way limiting. Other embodiments of the present invention will readily suggest themselves to such skilled persons having the benefit of this disclosure. Reference will now be made in detail to implementations of the present invention as illustrated in the accompanying drawings. The same reference indicators will be used throughout the drawings and the following detailed description to refer to the same or like parts.

In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application—and business-related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

In accordance with one embodiment of the present invention, the components, process steps, and/or data structures may be implemented using various types of operating systems (OS), computing platforms, firmware, computer programs, computer languages, and/or general-purpose machines. The method can be implemented as a programmed process running on processing circuitry. The processing circuitry can take the form of numerous combinations of processors and operating systems, or a stand-alone device. The process can be implemented as instructions executed by such hardware, hardware alone, or any combination thereof. The software may be stored on a program storage device readable by a machine.

In addition, those of ordinary skill in the art will recognize that devices of a less general purpose nature, such as hardwired devices, field programmable logic devices (FPLDs), including field programmable gate arrays (FPGAs) and complex programmable logic devices (CPLDs), application specific integrated circuits (ASICs), or the like, may also be used without departing from the scope and spirit of the inventive concepts disclosed herein.

In accordance with one embodiment of the present invention, the method may be implemented on a data processing computer such as a personal computer, workstation computer, mainframe computer, or high performance server running an OS such as Solaris® available from Sun Microsystems, Inc. of Palo Alto, Calif., Microsoft® Windows® XP and Windows® 2000, available form Microsoft Corporation of Redmond, Wash., or various versions of the Unix operating system such as Linux available from a number of vendors. The method may also be implemented on a multiple-processor system, or in a computing environment including various peripherals such as input devices, output devices, displays, pointing devices, memories, storage devices, media interfaces for transferring data to and from the processor(s), and the like. In addition, such a computer system or computing environment may be networked locally, or over the Internet.

Figure 6:
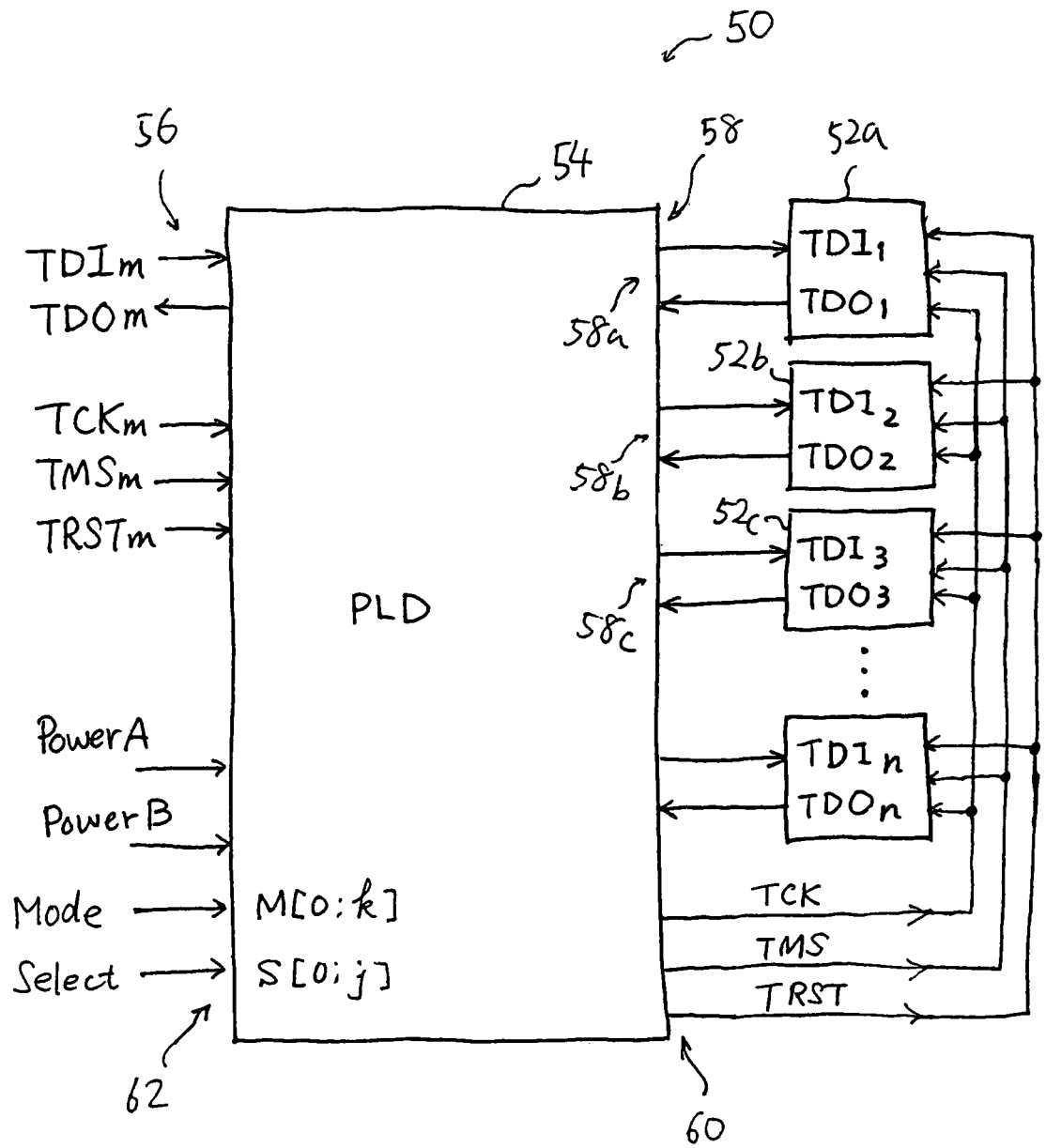
FIG. 6 is an electrical block diagram schematically illustrating a system for configuring a plurality of devices into a desired configuration in accordance with one embodiment of the present invention.

FIG. 6 schematically illustrates a system 50 for configuring a plurality of devices into a desired configuration in accordance with one embodiment of the present invention. As shown in FIG. 6, the system 50 includes a plurality of devices 52 (52a, 52b, ...) designed to access an electronic system, and a programmable logic device (PLD) 54. The system 50 and the electronic system may be implemented on a PCB. Each of the plurality of devices 52 complies with a test port architecture, for example, the IEEE 1149 standard, also referred to as the JTAG Test Port architecture. Each device 52 is driven by specific common control signals defined by the test port architecture, and provided with corresponding control pins and test data input/output pins. In accordance with the IEEE 1149 standard, the common control signals includes test clock (TCK), test mode selection (TMS), and optionally test reset (TRST) signals. Each device 52 has pins for Test_data_in (TDI), Test_Data_Out (TDO), Data_In (not shown), and Data_Out (not shown). In this example, the system 50 includes n-number of devices 52. Each of the devices 52 may be a device under test (DUT), CPU or DSP device targeted for debug, emulation, and the like.

The PLD 54 may be a stand-alone device or integrated into other programmable logic as necessary or desired. The PLD 54 is capable of configuring different connectivity among the plurality of devices 52 based on at least one input control signal. Based on the input control signal, the program in the PLD 54 controls routing and connectivity among the plurality of devices 52 by configuring the devices 52 into a desired configuration. The configured chain is used for testing, debug, programming, downloading, bug fixing, and the like, as described above.

In the following description, the embodiments are described using the IEEE1149 standard. However, the present invention is not limited to a specific standard or test architecture, but also applicable to any architecture providing port and signal definition allowing access to an electronic system. It should also be noted that only signals relevant to describe embodiments of the present invention are shown in the diagrams. However, other signals typically used in the system will easily be understood by one of ordinary skill in the art without further explanation.

As shown in FIG. 6, the PLD 54 is connected to the plurality of devices 52, and capable of interfacing the plurality of devices 52 with a test port 56. For example, the PLD 54 has an interface 58 which includes ports 58a, 58b, . . . , connected to the corresponding devices 52 (52a, 52b, . . . ), the test port 56, a common signal port 60, and a control signal port 62. The common signals (TCK, TMS, and optionally TRST) are supplied to each of the devices 52 via the common signal port 60. The common signal port 60 may be duplicated to provide multiple copies as desired. The test port 56 includes a Test_Data_In (TDI) pin, a Test_Data_Out (TDO) pin, a Test Clock (TCK) pin, a Test Mode Selection (TMS) pin, and optionally a Test Reset (TRST) pin. One or more test ports may be added (for example, total m ports) for more flexibility as needed or desired. For example, multiple test ports provide greater accessibility to different applications such as emulation, debug, testing, downloading, and the like, or incompatible tools from different vendors.

Figure 8A:
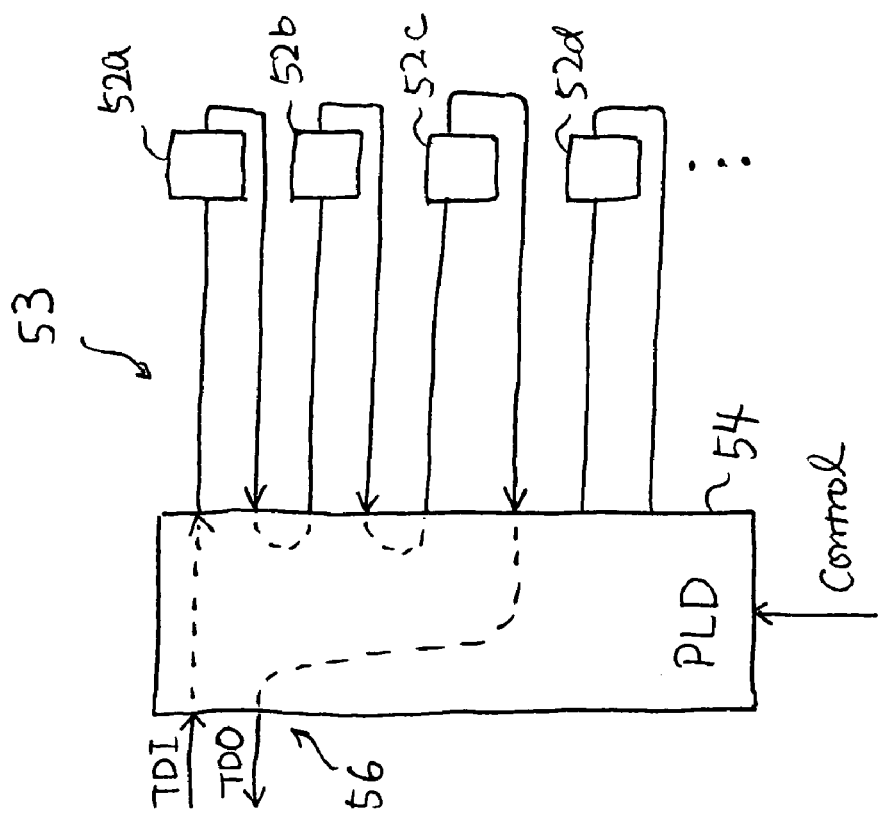
FIG. 8A is an electrical diagram schematically illustrating an example in which a group of selected devices are configured into a partial chain coupled to the test port in accordance with one embodiment of the present invention.
Figure 7:
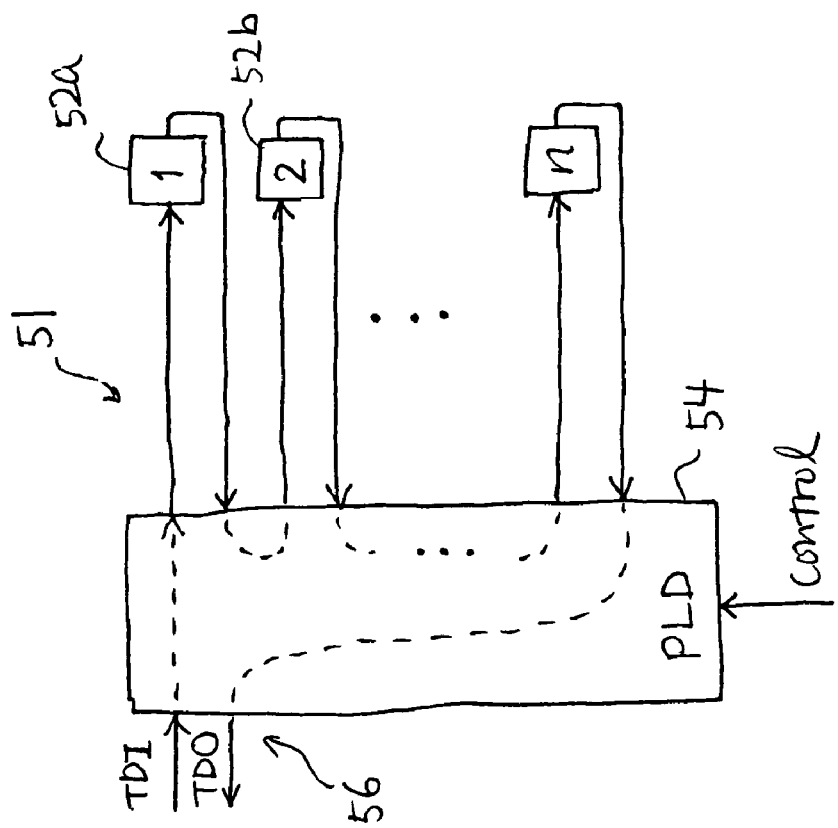
FIG. 7 is an electrical block diagram schematically illustrating an example in which a plurality of devices are configured into a single chain coupled to the test port in accordance with one embodiment of the present invention.
Figure 9:
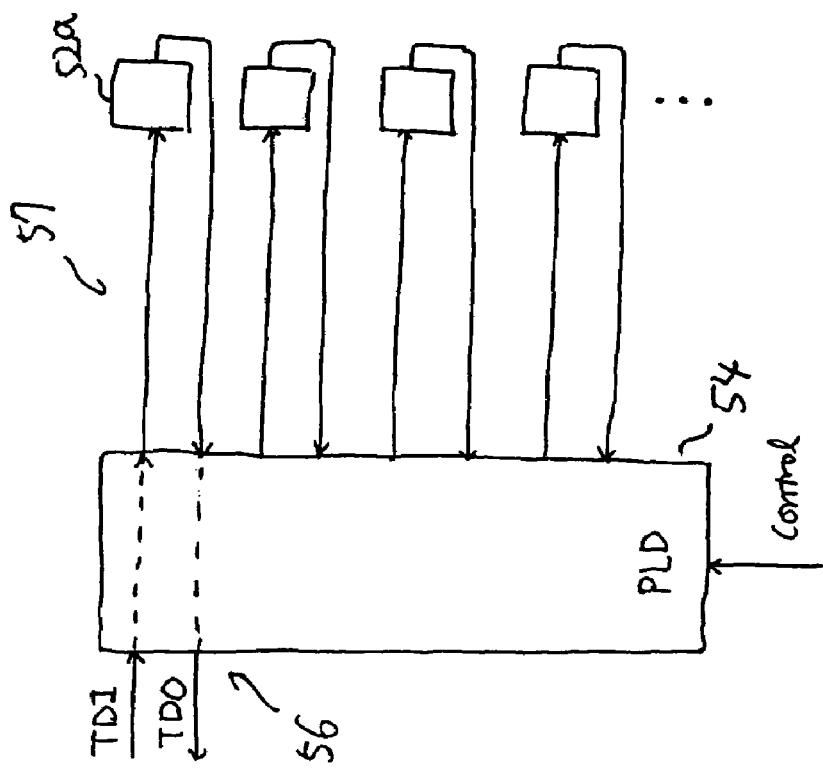
FIG. 9 is an electrical diagram schematically illustrating an example in which a particular device is selected and isolated from among other devices to form a single-device chain coupled to the test port in accordance with one embodiment of the present invention.
Figure 8B:
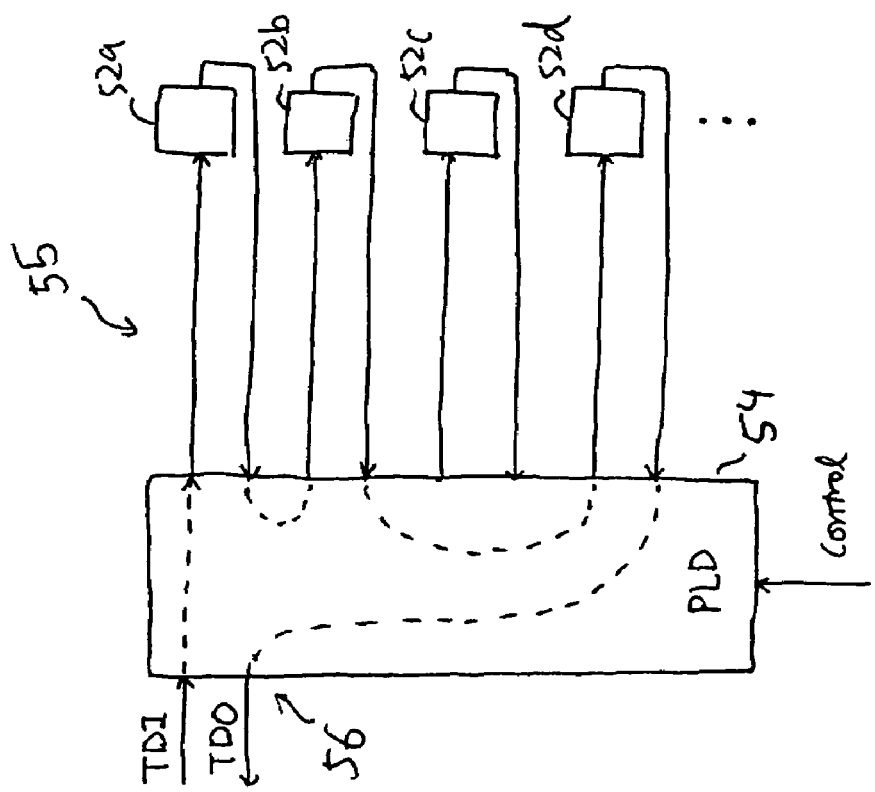
FIG. 8B is an electrical diagram schematically illustrating another example in which a group of selected devices are configured into a partial chain coupled to the test port in accordance with one embodiment of the present invention.

In accordance with one embodiment of the present invention, the control signal includes a mode signal (M) to indicate a specific configuration of the connectivity of the devices 52, and may also includes a selection signal (S) to specify at least one particular devices 52 for a given configuration. For example, such specific configuration include a (default) configuration as shown in FIG. 7, in which the plurality of devices 52 form a single chain 51 coupled to the test port 56. FIG. 8A schematically illustrates another configuration in which a group of selected devices 52a through 52c forms a partial chain 53 coupled to the test port 56. In FIG. 8B, a group of selected devices 52a, 52b, and 52d form a partial chain 55 coupled to the test port 56, where the device 52c is skipped or bypassed. Accordingly, any device(s) can be selected or bypassed as desired without providing stuff option resistors. FIG. 9 schematically illustrates a configuration in which a particular device (for example, device 52a) is selected and isolated from among other devices to form a single-device chain 57 coupled to the test port 56. It should be noted that the common signals are not shown in FIGS. 7-9 for simplicity.

Thus, in accordance with one embodiment of the present invention, for any custom design requirement, a desired chain of selected device(s) is simply configured and re-configured by changing the PLD program or by varying the control inputs to a particular program. For example, the devices to be stuffed or un-stuffed (inserted into or removed from the chain) can be simply specified by the appropriate programmed device number for the PLD. Any new or unexpected option or combination of options can also be implemented in the same manner.

The example mode signals and the select signals may be driven by either the manufacturing In-Circuit Test (ICT) fixture or by the local CPU or other control circuit. The mode and select bits define the device chain as needed for various applications. For example, in a first mode (mode bits "00", for example), all devices 52 may be chained together into a single chain, for example, for manufacturing boundary scan test. In a second mode (mode bits "01", for example), one of a plurality of sub-chains may be selected. For example, if the entire chain may include devices from various vendors, devices from the same vendor may be grouped into a respective sub-chain ("private" chain). A further selection (select bits "01", for example) may select one particular device from among the plurality of the devices 52.

The mode and select bits may be used to specify access to a specific group of devices, and only the corresponding ports 58 connected to those devices may be activated. For example, this may be used to download the configuration information to the selected devices from the same vendor. In addition, a respective test port 56 may be provided for each vendor specific tool, or dedicated to each application. For example, a vendor specific test port 56 may be used to access a sub-chain of that vendor's devices, or an emulation (or debug) tool may use a specific test port 56 for emulation (or debug) to gain access to a particular device 52 via a corresponding port 58. The single-device-access mode can also be used to select or isolate a particular device 52 so as to access its registers or internal memory in odder to fix or bypass defects in the device. The dedicated test ports and the chain/device selection by the mode and select bits may also be used in combination.

Figure 10:
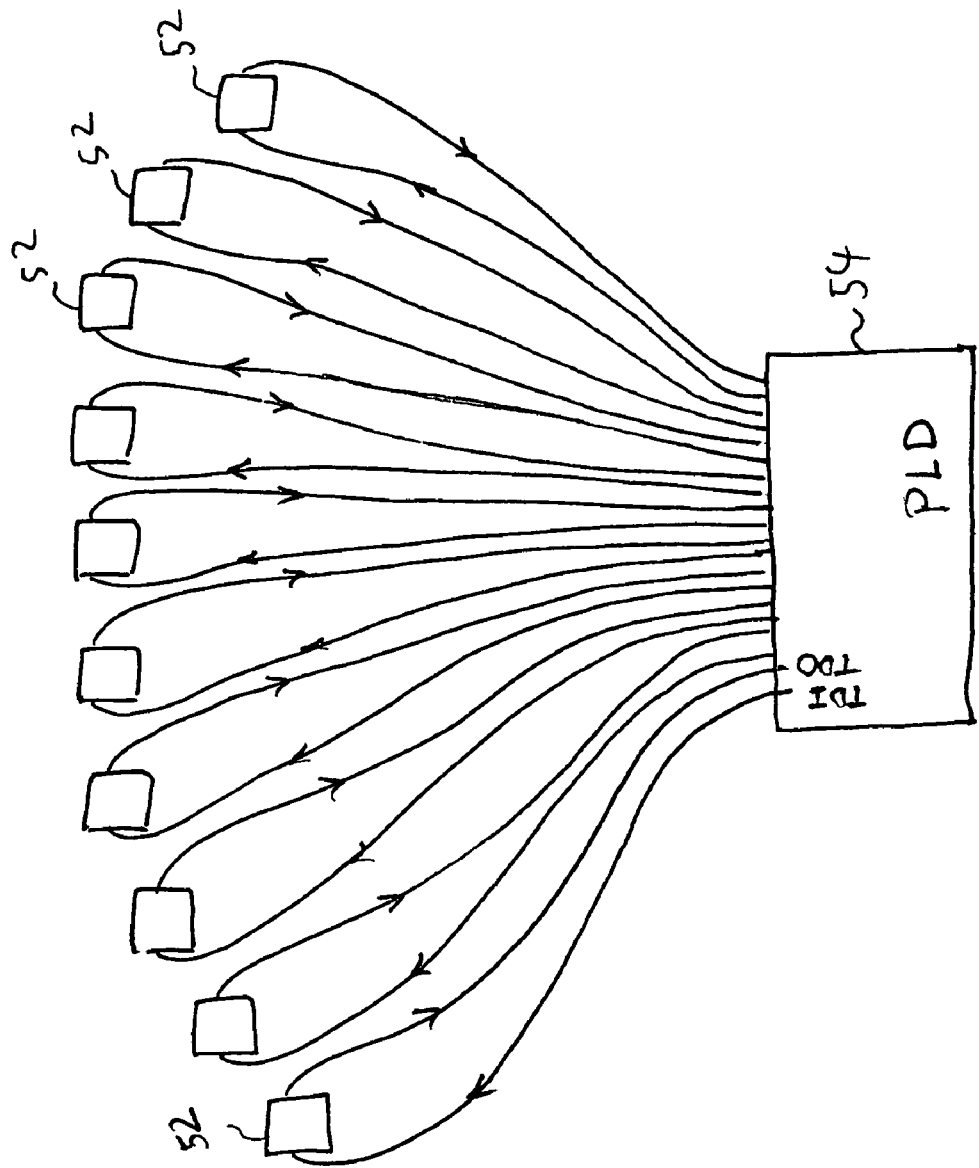
FIG. 10 is a diagram schematically illustrating an example in which the individual devices are connected to the PLD in a star topology in accordance with one embodiment of the present invention.
Figure 11:
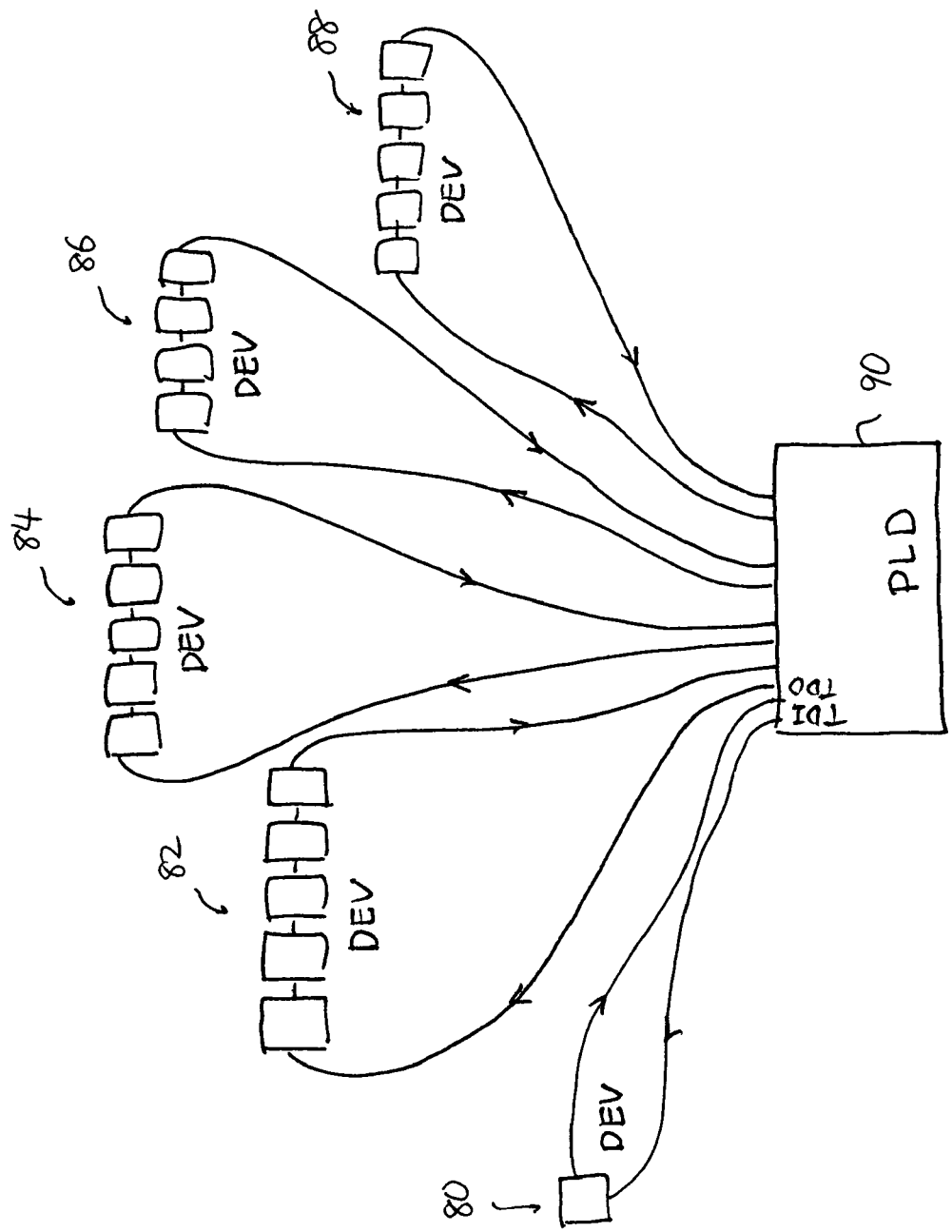
FIG. 11 is a diagram schematically illustrating is a diagram schematically illustrating an example in which groups of devices are connected to the PLD in a star topology in accordance with one embodiment of the present invention

In the embodiments described above referring to FIGS. 6 through 9, the individual devices 52 are connected to the PLD 54 in a star topology as shown in FIG. 10. However, the present invention is not limited to the single-device star topology. As shown in FIG. 11, a group of devices (DEV) 80, 82, . . . may be connected to the PLD 90 in a star topology in accordance with one embodiment of the present invention. Each group may include one or more devices as shown in FIG. 11. The connectivity of the devices are managed group by group rather than device by device. However, the connectivity of the groups is still centrally controlled and configured by the PLD 90. The above-discussed features such as mode/select control and voltage control are similarly applicable to the groups.

In accordance with one embodiment of the present invention, the control signal includes a power indication signal indicating status of a corresponding power supply for devices in a mixed-voltage PCB environment. For example, as shown in FIG. 6, if the system includes power supply levels A=5V and B=3.3V, the corresponding power indication signal is logically asserted whenever the power supply is found good. The power indication signals are used as a respective enable signal which ensures that TDI signal and other control signals are not driven into any device until the device is completely powered up into a known state.

Figure 12:
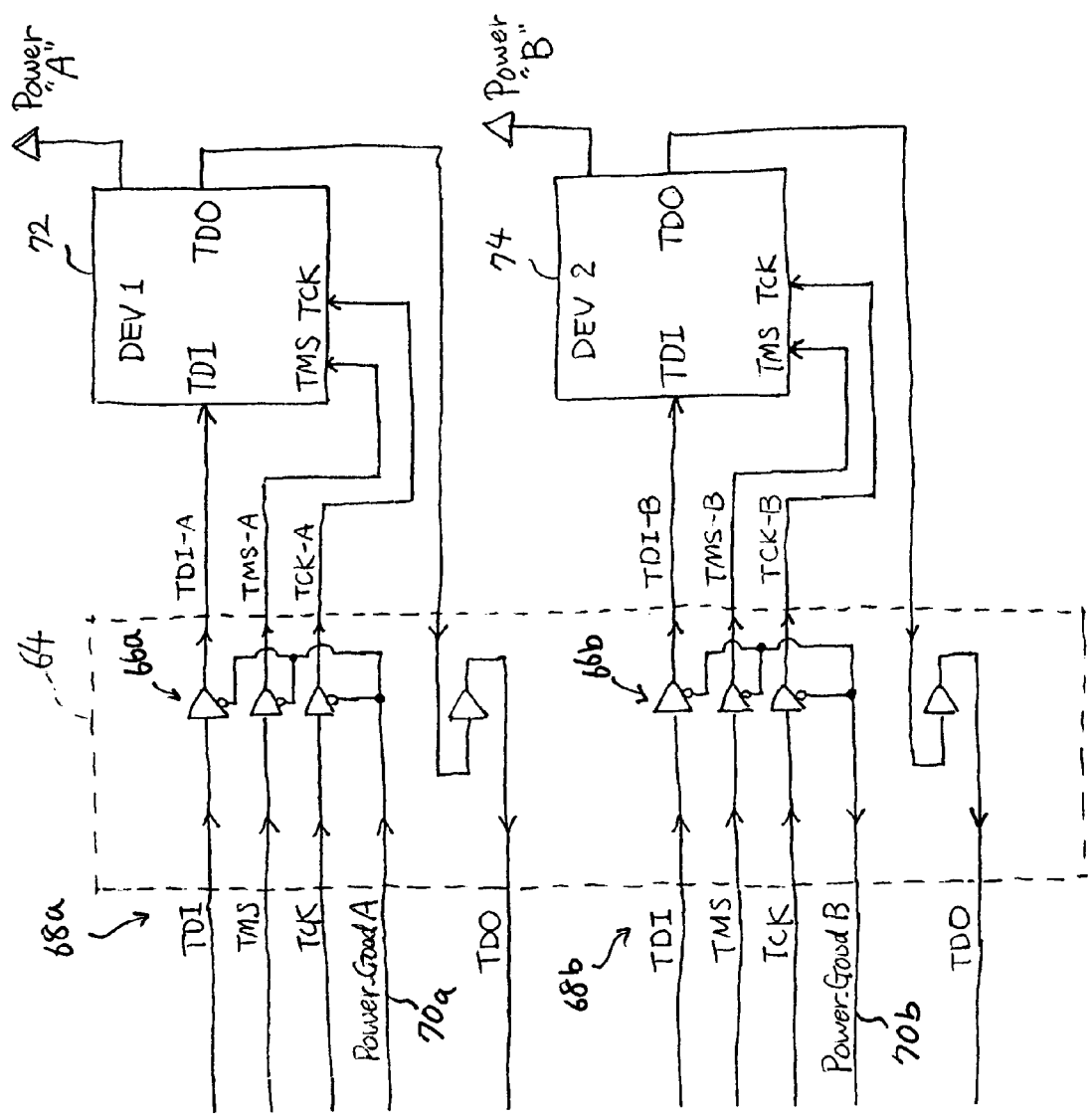
FIG. 12 is an electrical diagram schematically illustrating an example of a voltage control part of the PLD in accordance with one embodiment of the present invention.

FIG. 12 schematically illustrates an example of a voltage control part 64 of the PLD in accordance with one embodiment of the present invention. As shown in FIG. 12, a set of buffers 66 can be provided to a port 68a coupled to a group of devices (DEV 1) 72 connected to a power supply A. The power indication signal (Power_Good A) 70a is used to drive the buffers 66 such that the devices 72 receive the TDI signal (and the common signals) only when the power indication signal 70a is asserted. Similarly, a set of buffers 66b enabled by another power indication signal (Power_Good B) 70b corresponding to a power supply B are provided to a port 68b coupled to a group of devices (DEV 2) 74 connected to the power supply B. Thus, the TDI, TMS, and TCK signals, which are coupled via the configured chain connectivity (interconnections controlled by the program part in the PLD), are input to the devices (as signals TDI_A, TMS_A, TCK_A, for example) only when the devices are powered-up by a corresponding power supply. Although this example only illustrates two power indication signals, a desired number of power indication signals can be used for the corresponding groups of devices in accordance with the power supplies of a different voltage level in the system. In addition, as mentioned above, a "group of devices" also includes a single-device group. This mixed-voltage device management saves space and cost of the PCB, since external buffers at the TDI input of each device are no longer needed.

In accordance with one embodiment of the present invention, the PLD satisfies the following requirements with regard to power supply voltage. First, until the PLD is fully powered up and configured, all Input/Output pins remain in tristate (high impedance) state. This prevents the PLD from causing unexpected activity in the chain during the power-up sequence. Secondly, whether or not the PLD is fully powered up, the PLD tolerates reasonable voltage levels driven into its inputs. This prevents damage to the PLD itself during the power-up sequence.

Figure 13:
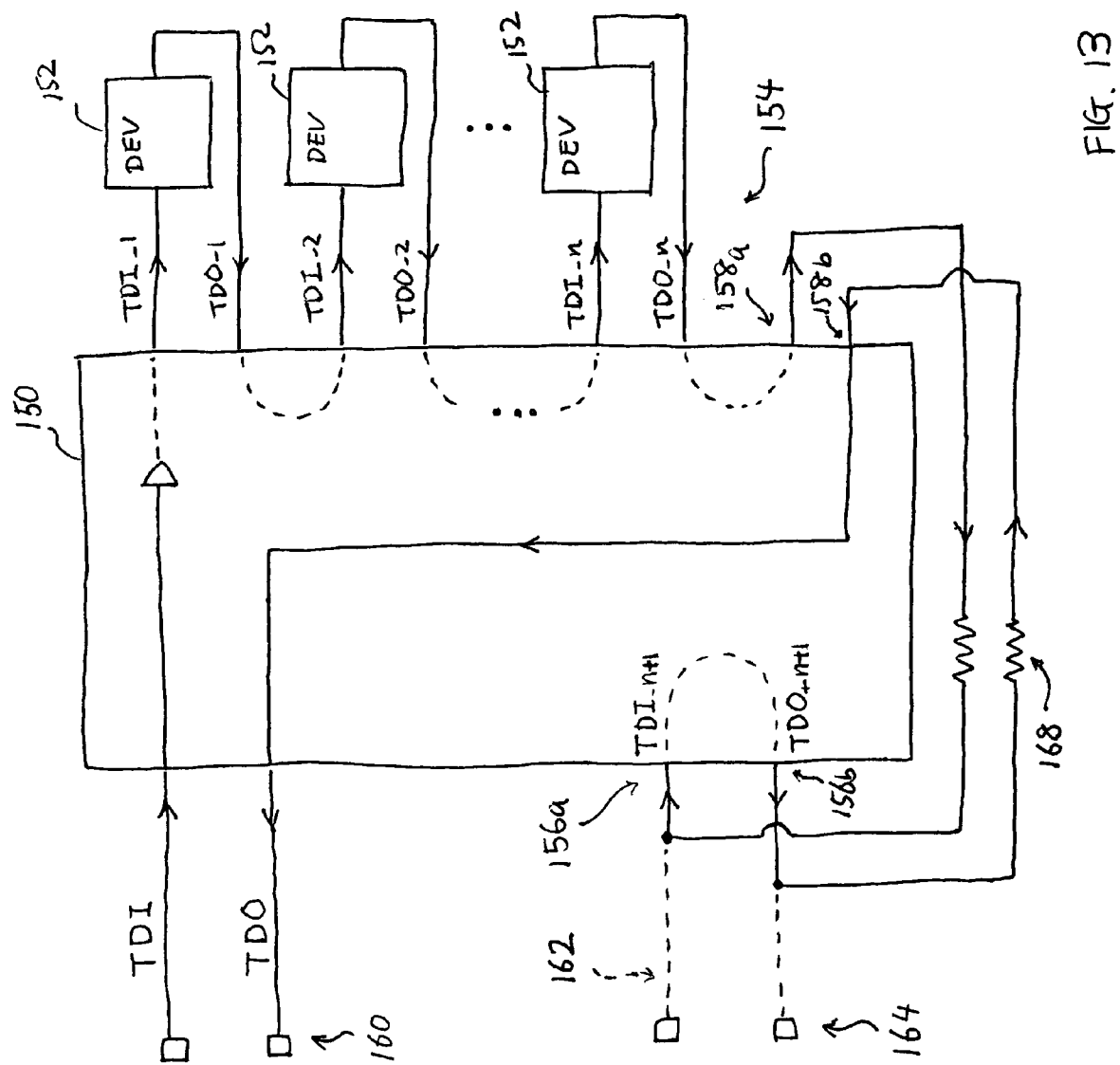
FIG. 13 is an electrical block diagram schematically illustrating a PLD in accordance with one embodiment of the present invention, in which the PLD's native test port is included in the device chain.

FIG. 13 schematically illustrates a PLD 150 in accordance with one embodiment of the present invention, in which the PLD's own test port (native port) is included in the device chain. In this example, device ("DEV") 152 stands for an individual device or a group of devices. In a manufacturing test, for example, a plurality of devices 152 are configured into a single chain 154 by programmable logic of the PLD 150. In addition to interconnecting the ports of the devices 152, a native test port 156 (pins 156a and 156b, TDI_n+1, TDO_n+1) of the PLD 150 is also connected to the chain 154. This may be done by coupling an available general-purpose I/O port 158 (pins 158a and 158b) of the PLD 150 to the native test port 156 of the PLD 150. As shown in FIG. 13, the last TDO signal (TDO_n) from the devices 152 is output from the output pin 158a and coupled to the native test TDI (TDI_n+1) 156a of the PLD 150. The native TDO (TDO_n+1) 156b is then internally coupled to the global TDO of the test port 160 via an input pin 158b of the PLD 150. The native test port 156 is used to access internal circuitry of the PLD 150, rather than the electronic system 152 which is under test. Accordingly, by making the PLD 150 part of the chain 154, the PLD 150 can also be tested during manufacturing of the PCB. It should be noted that the common control signals (TMS, TCK) are not depicted in FIG. 13 for simplicity.

In accordance with one embodiment of the present invention, the programming part of the PLD 150 may be programmed using the native test port 156. As shown in FIG. 13, the native test port 156 is tapped off (162) to a separate PLD programming port 164. In this case, resistors 168 are provided between the native test port pins (156a and 156b) and the general I/O port pins (158a and 158b) of the PLD 150 so as to allow a test fixture to drive the native test port pins without regard to voltages driven on the terminals 158 by the device 150 during the programming sequence.

Figure 14:
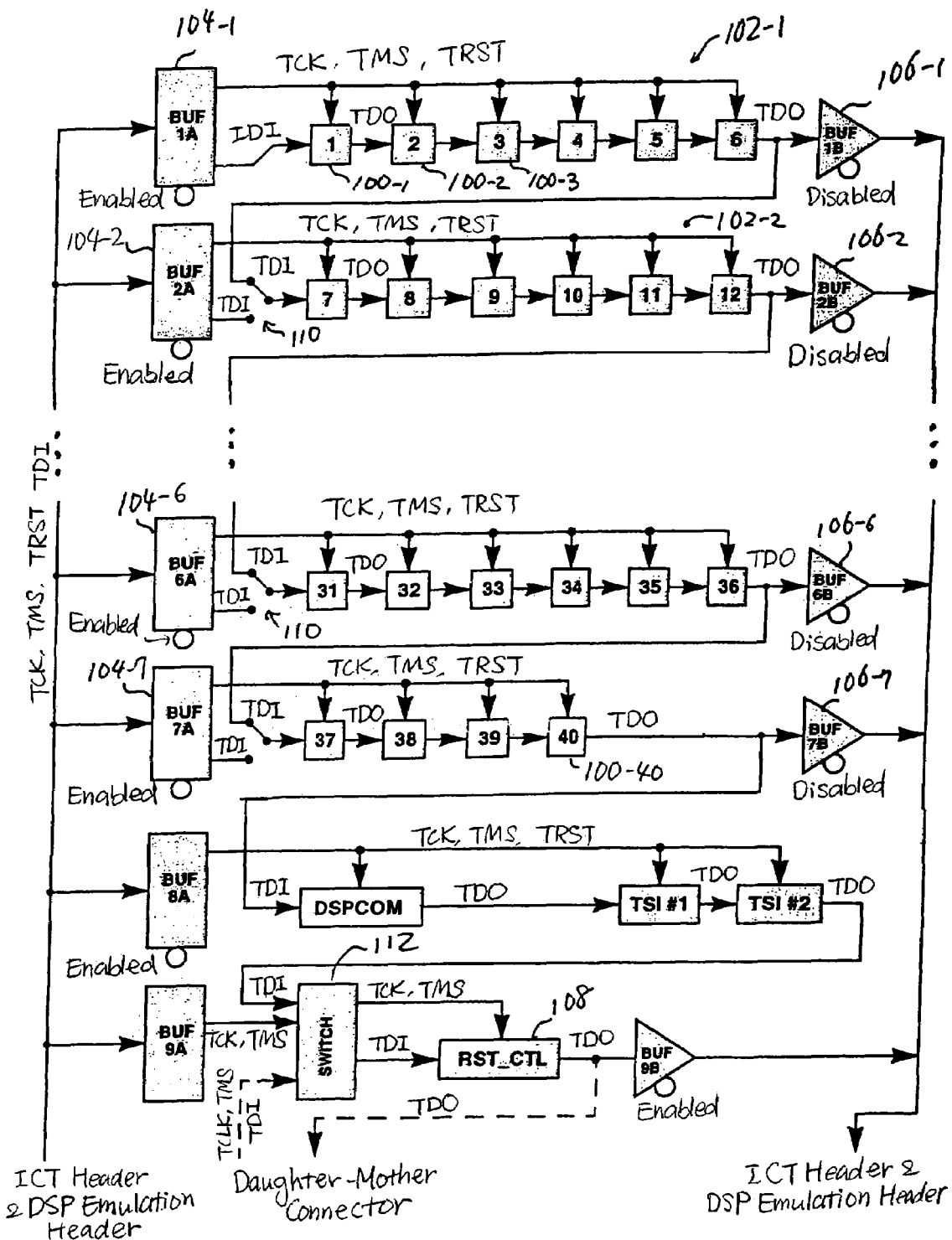
FIGS. 14 and 15 are electrical block diagrams schematically illustrating a chain of devices adapted to be configured into a different topology based on a specific environment in accordance with one embodiment of the present invention.
Figure 15:
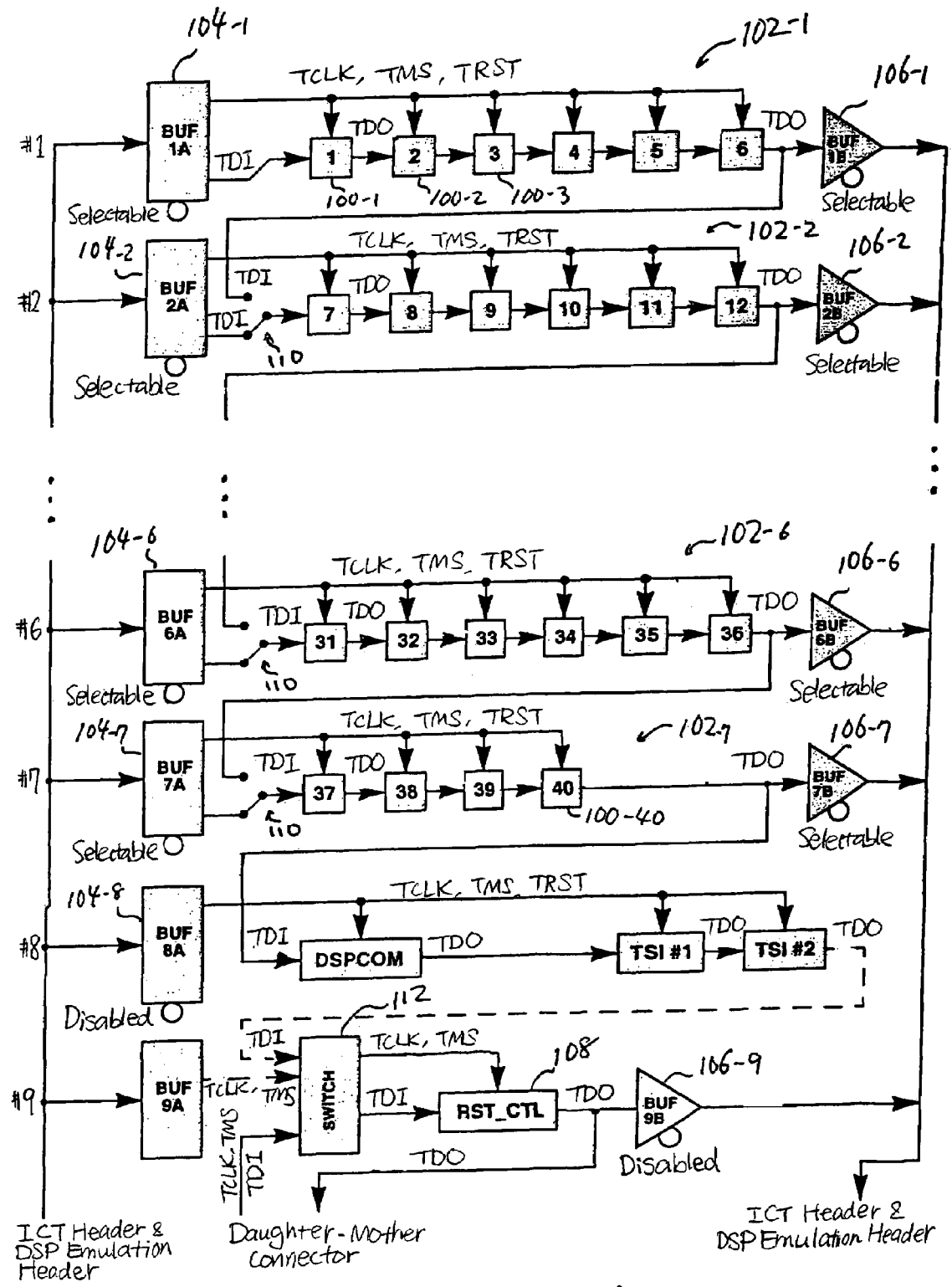

FIGS. 14 and 15 schematically illustrate a chain of devices adapted to be configured into a different topology based on a specific environment (for example, manufacturing or emulation) in accordance with one embodiment of the present invention. The chain may be a boundary-scan chain. The chain may be used to access an electronic system including DSP chips, FPGA, PLD, and the like, provided on a PCB, and is connected to an in-circuit-test (ICT) header and a DSP emulation header (not shown). These two test headers are not used at the same time. In this example, the chain includes forty (40) devices 100 (100-1, 100-2, ... 100-40) complying with the IEEE 1149 standard (JTAG Test Port architecture). First buffers 104 (104-1, 104-2, ... ) and second buffers 106 (106-1, 106-2, ... ) are inserted to divide the chain into seven sub-chains 102 (102-1, 102-2, ... ). In a manufacturing environment, the chain behaves as a single chain under the control of a controller 108. Connections of the devices and buffers to the controller 108 is not shown in the diagrams for simplicity. In a DSP emulation environment, the chain is logically broken up into the sub-chains. It should be noted that the number of devices, the number and length of the sub-chains are shown by way of example and is not intended to be exhaustive or limiting in any way.

The ICT test header may provide an indication signal indicating that the system is in the manufacturing test environment. The manufacturing environment enables the first buffers 104 and disables the second buffers 106. Switches 110 are set so as to connect all of the devices 100 into one single chain, as shown in FIG. 14. The switch 112 also selects all test signals (JTAG signals) from the ICT test header and ignores other signals in this environment.

In the DSP emulation environment, as shown in FIG. 15, the chain is connected to the DSP test header, which does not provide the indication signal, and is divided into sub-chains. The sub-chains 102 (102-1 through 102-7) are connected to the corresponding first buffers 104 (104-1 through 104-7) and second buffers 106 (106-1 through 106-7). The buffers 104-8 and 106-9 are disabled. The first buffers 104-1 through 104-7 and the second buffers 106-1 through 106-7 are selectable on a pair-wise basis. This enables individual sub-chains to be activated one at a time. For example, to allow access to the sub-chain 102-2, the buffers 104-2 and 106-2 are enabled, while all other buffers remain disabled. In addition to providing this selection mechanism, the buffers may also used to maintain signal quality for the clock and control signals.

The controller 108 controls which sub-chain is to be enabled, and forwards the corresponding emulation inputs from the selected sub-chain to the DSP emulation test header. In the DSP emulation environment, the switch 112 selects test signals from the daughter-mother controller and ignores signals from the test headers.

In this embodiment, the connectivity or topology of the device chain is changed between a single chain and a plurality of divided sub-chains. The connectivity control is locally done by buffer pairs provided among the sub-chains.

Figure 16:
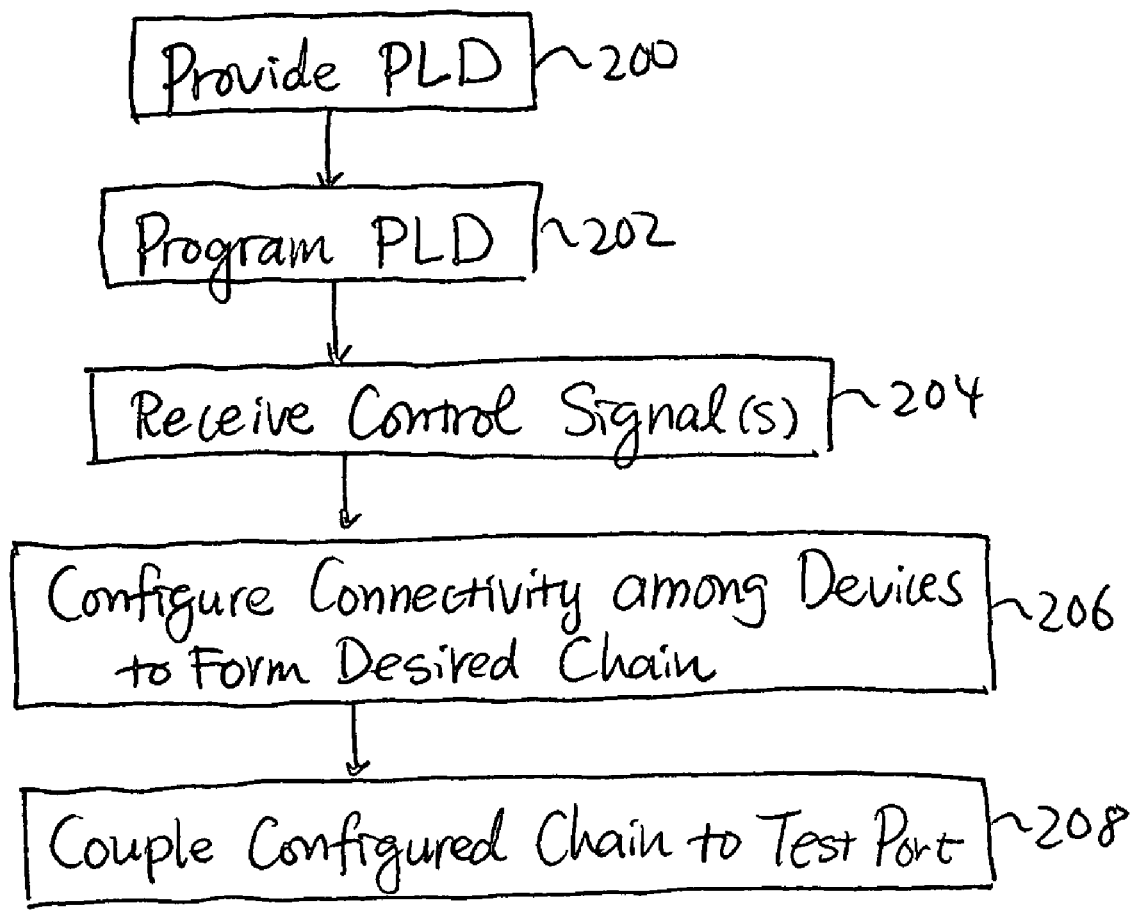
FIG. 16 is a process flow diagram schematically illustrating a method for configuring a plurality of devices on a PCB into a desired configuration in accordance with one embodiment of the present invention.

FIG. 16 schematically illustrates a method for configuring a plurality of devices on a PCB into a desired configuration in accordance with one embodiment of the present invention. The devices are designed to access an electronic system and comply with a test port architecture. First a programmable logic device (PLD) is provided on the PCB such that the PLD interfaces with a test port and also is connected to the plurality of devices (200). The PLD is programmed (202), as described above, such that it is capable of configuring different connectivity among the plurality of devices based on at least one input control signal. When the input control signal is received (204), one or more devices are configured into a chain as specified by the control signal (206). The control signal may include a mode signal indicating a specific configuration of the connectivity, a selection signal specifying at least one particular devices, and/or a power indication signal indicating a status of corresponding power supply for devices, as described above. This configuration includes configuring a partial chain including a group of the devices selected from among the plurality of devices, and selecting a specific device for a single-device chain. The configuration may also include activating specific ports coupled to selected devices, as described above. The configured chain (or selected device) is coupled to the test port via the PLD (208).

While embodiments and applications of this invention have been shown and described, it would be apparent to those skilled in the art having the benefit of this disclosure that many more modifications than mentioned above are possible without departing from the inventive concepts herein. The invention, therefore, is not to be restricted except in the spirit of the appended claims.

What is claimed is:

1. A system on a circuit board, said system comprising:
a plurality of devices designed to access an electronic system on the circuit board, each of said plurality of devices complying with a test port architecture; and
a programmable logic device (PLD) connected to the plurality of devices, said PLD interfacing said plurality of devices with a test port, said PLD being capable of configuring different connectivity among the plurality of devices based on an input control signal, the control signal including a power indication signal indicating the status of a corresponding power supply from among two or more power supplies having differing power supply levels, each power supply providing power to a corresponding group of devices, the control signal including a mode signal and a selection signal to specify a group of one or more devices, limiting activation to ports corresponding to the specified group of devices, said PLD being capable of selecting, device by device, at least one desired device from among the plurality of devices to form a chain of devices having a desired connectivity among the devices.

2. The system of claim 1, wherein the test port architecture complies with the IEEE 1149 standard.

3. The system of claim 1, wherein said PLD comprises:
an interface connected to each of the plurality of devices;
the test port comprising
a serial test-data-in (TDI) port,
a serial test-data-out (TDO) port,
a common test clock (TCK) port, and
a common test mode selection (TMS) port; and
a control signal port adapted to receive the input control signal.

4. The system of claim 3, wherein the test port further comprises:
an optional test reset (TRST) port.

5. The system of claim 3, wherein said PLD further comprises:
a second interface coupled with the test port and the interface connected to each of the plurality of devices, adapted to configure said PLD into a chain of the devices.

6. The system of claim 1, wherein the plurality of devices comprises boundary-scan cells (BSCs).

7. The system of claim 1, wherein the plurality of devices comprises built-in self-test (BIST) devices.

8. The system of claim 1, wherein the plurality of devices comprises digital signal processors (DSPs).

9. The system of claim 1 wherein each power supply provides power to a corresponding group of devices, the power indication signal enabling control signals to be driven into a device of the group of devices upon the device being powered to a known state.

10. The system of claim 1 wherein the mode signal indicates a mode selected from a plurality of modes, the selected mode indicating a sub-chain including only devices from a particular vendor.

11. A method for configuring a plurality of devices into a desired configuration, the devices being designed to access an electronic system and complying with a test port architecture, said method comprising:
providing a programmable logic device (PLD) interfacing with a test port and connected to the plurality of devices, said PLD being capable of configuring different connectivity among the plurality of devices;
receiving a control signal at the PLD, the control signal including a power indication signal indicating the status of a corresponding power supply from among two or more power supplies having differing power supply levels each power supply providing power to a corresponding group of devices, the control signal including a mode signal and a selection signal to specify a group of one or more devices, limiting activation to ports corresponding to the specified group of devices, the power indication signal enabling control signals to be driven into a device of the group of devices upon the device being powered to a known state;
configuring, using the PLD, at least one of the plurality of devices into a chain based on the control signal, said configuring including selecting, device by devices at least one desired device from among the plurality of devices to form a chain of devices having a desired connectivity among the devices; and
coupling the configured chain to the test port via the PLD.

12. The method of claim 11, wherein said configuring comprises:
configuring the plurality of devices into a single chain.

13. The method of claim 11, wherein said configuring comprises:
configuring a partial chain including a group of the devices selected from among the plurality of devices.

14. The method of claim 11, wherein said configuring comprises:
select a specific device for the chain.

15. The method of claim 11, wherein the plurality of devices comprises boundary-scan cells (BSCs).

16. The method of claim 11, wherein the plurality of devices comprises built-in self-test (BIST) devices.

17. The system of claim 11, wherein the plurality of devices comprises digital signal processors (DSPs).

18. The method of claim 11, wherein the electronic system is an integrated circuit on a printed circuit board.

19. The method of claim 11 wherein each power supply provides power to a corresponding group of devices, the power indication signal enabling control signals to be driven into a device of the group of devices upon the device being powered to a known state.

20. The method of claim 11 wherein the mode signal indicates a mode selected from a plurality of modes, the selected mode indicating a sub-chain including only devices from a particular vendor.

21. An apparatus for configuring a plurality of devices into a desired configuration, the devices being designed to access an electronic system and complying with a test port architecture, said apparatus comprising:
means for receiving an input control signal, the control signal including a power indication signal indicating the status of a corresponding power supply from among two or more power supplies having differing power supply levels each power supply providing power to a corresponding group of devices, the control signal including a mode signal and a selection signal to specify a group of one or more devices, limiting activation to ports corresponding to the specified group of devices;
means for interfacing with each of the plurality of devices;
means for configuring different connectivity among the plurality of devices based on the input control signal, at least one of the plurality of test devise being configured into a chain, said means for configuring including means for selecting, device by device, at least one desired device from among the plurality of devices to form a chain of devices having a desired connectivity among the devices; and
means for coupling the configured chain to a test port.

22. The apparatus of claim 21, wherein the configured chain includes one of:
a single chain of the plurality of devices;
a partial chain including a group of devices selected from among the plurality of devices; and
a chain including a single device.

23. The apparatus of claim 21, wherein said means for configuring comprises a programmable logic device (PLD).

24. The apparatus of claim 21, wherein the plurality of devices comprises boundary-scan cells (BSCs).

25. The apparatus of claim 21, wherein the plurality of devices comprises built-in self-test (BIST) devices.

26. The apparatus of claim 21, wherein the plurality of devices comprises digital signal processors (DSPs).

27. The apparatus of claim 21, wherein the electronic system is an integrated circuit on a printed circuit board.

28. The apparatus of claim 21 wherein each power supply provides power to a corresponding group of devices, the power indication signal enabling control signals to be driven into a device of the group of devices upon the device being powered to a known state.

29. The apparatus of claim 21 wherein the mode signal indicates a mode selected from a plurality of modes, the selected mode indicating a sub-chain including only devices from a particular vendor.

30. A printed circuit board (PCB) comprising:

an electronic system provided on the PCB;

a plurality of devices designed to access the electronic system and complying with a test port architecture; and a programmable logic device (PLD) connected to the plurality of devices, said PLD interfacing said plurality of devices with a test port, capable of configuring different connectivity among the plurality of devices based on an input control signal, the control signal including a power indication signal indicating the status of a corresponding power supply from among two or more power supplies having differing power supply levels, each power supply providing power to a corresponding group of devices, the control signal including a mode signal and a selection signal to specify a group of one or more devices, limiting activation to ports corresponding to the specified group of devices, said PLD being capable of selecting, device by device, at least one desired device from among the plurality of devices to form a chain of device having a desired connectivity among the devices.

31. The printed circuit board of claim 30, wherein the test port architecture complies the IEEE 1149 standard.

32. The printed circuit board of claim 30, wherein said PLD comprises:

an interface connected to each of the plurality of devices; the test port comprising
    a serial test-data-in (TDI) port,
    a serial test-data-out (TDO) port,
    a common test clock (TCK) port, and
    a common test mode selection (TMS) port; and a control signal port adapted to receive the input control signal.

33. The printed circuit board of claim 32, wherein the test port further comprises:

an optional test reset (TRST) port.

34. The printed circuit board of claim 32, wherein said PLD further comprises:

a second interface coupled with the test port and the interface connected to each of the plurality of devices, adapted to configure said PLD into a chain of the devices.

35. The printed circuit board of claim 30, wherein the input control signal comprises:

a mode signal to indicate a specific configuration of the connectivity.

36. The printed circuit board of claim 30, wherein the plurality of devices comprises boundary-scan cells (BSCs).

37. The printed circuit board of claim 30, wherein the plurality of devices comprises built-in self-test (BIST) devices.

38. The printed circuit board of claim 30, wherein the plurality of devices comprises digital signal processors (DSP).

\* \* \* \* \*